(12) United States Patent
Kawasaki et al.

(10) Patent No.: US 10,854,427 B2
(45) Date of Patent: Dec. 1, 2020

(54) RADIO FREQUENCY (RF) PULSING IMPEDANCE TUNING WITH MULTIPLIER MODE

(71) Applicant: APPLIED MATERIALS, INC., Santa Clara, CA (US)

(72) Inventors: Katsumasa Kawasaki, San Jose, CA (US); Justin Phi, Milpitas, CA (US); Kartik Ramaswamy, San Jose, CA (US); Sergio Fukuda Shoji, San Jose, CA (US); Daisuke Shimizu, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/117,457

(22) Filed: Aug. 30, 2018

(65) Prior Publication Data
US 2020/0075290 A1   Mar. 5, 2020

(51) Int. Cl.
*H01J 37/32* (2006.01)
*H01L 21/3065* (2006.01)

(52) U.S. Cl.
CPC .. *H01J 37/32146* (2013.01); *H01J 37/32183* (2013.01); *H01J 2237/334* (2013.01); *H01L 21/3065* (2013.01)

(58) Field of Classification Search
CPC .......... H01J 37/32146; H01J 37/32183; H01J 2237/334; H01L 21/3065; H01L 21/67069
USPC .............. 438/706, 710, 712, 714, 719, 720; 156/345.15, 345.28, 345.35, 345.44, 156/345.48
See application file for complete search history.

(56) References Cited

U.S. PATENT DOCUMENTS

| | | | |
|---|---|---|---|
| 8,404,598 B2 | 3/2013 | Liao et al. | |
| 9,614,524 B1 | 4/2017 | Kawasaki | |
| 9,741,539 B2 | 8/2017 | Kawasaki et al. | |
| 9,754,767 B2 | 9/2017 | Kawasaki | |
| 9,788,405 B2* | 10/2017 | Kawasaki | H05H 1/46 |
| 9,872,373 B1 | 1/2018 | Shimizu et al. | |
| 2008/0236490 A1* | 10/2008 | Paterson | H01J 37/32091 118/723 I |
| 2016/0126069 A1* | 5/2016 | Kwon | H05B 31/26 315/111.21 |

(Continued)

*Primary Examiner* — Lan Vinh
(74) *Attorney, Agent, or Firm* — Moser Taboada; Alan Taboada

(57) ABSTRACT

Methods for RF pulse reflection reduction are provided herein. In some embodiments, a method for processing a substrate in a plasma enhanced substrate processing system using multi-level pulsed RF power includes; receiving a process recipe for processing the substrate that includes a plurality of pulsed RF power waveforms from a plurality of RF generators, using the master RF generator to generate a transistor-transistor logic (TTL) signal having a base frequency and a first duty cycle, setting a multiplier for each RF generator, dividing the first duty cycle into a high level interval and a low level interval, determining a frequency command set for each RF generator and sending the frequency command set to each RF generator, wherein the frequency command set includes a frequency set point for each RF generator; and providing the plurality of pulsed RF power waveforms from the plurality of RF generators to a process chamber.

20 Claims, 7 Drawing Sheets

(56) References Cited

U.S. PATENT DOCUMENTS

2018/0115299 A1\* 4/2018 Nagami ............ H01J 37/32165
2018/0261430 A1    9/2018 Kawasaki \* cited by examiner

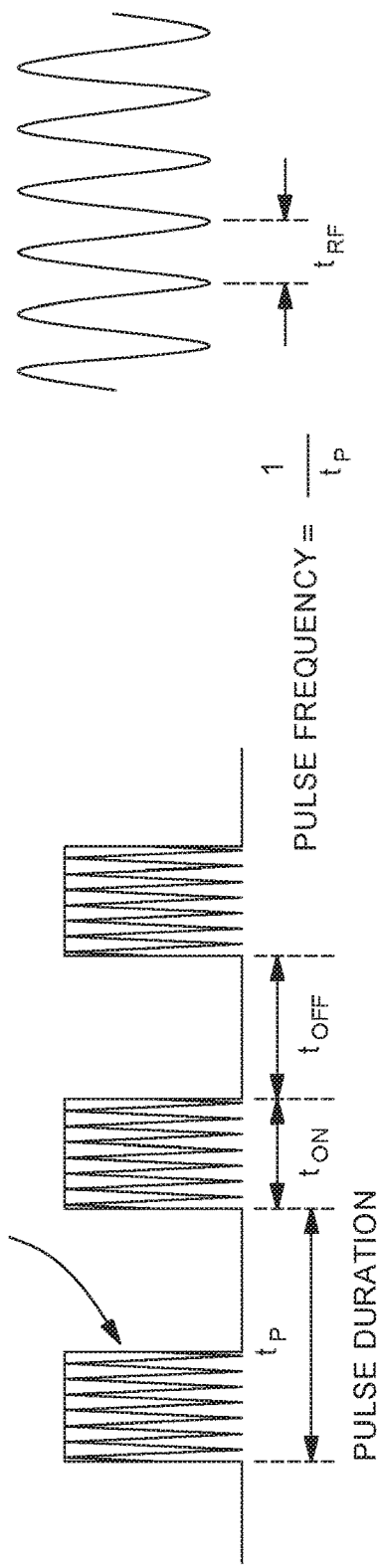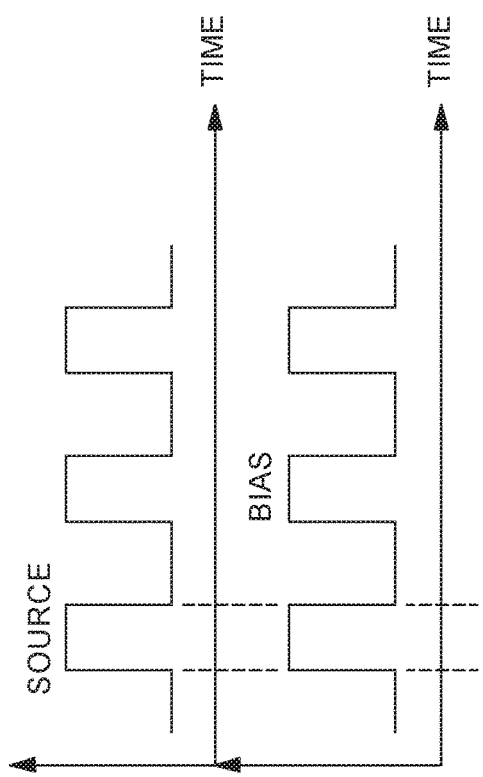
FIG. 3A
FIG. 3B
FIG. 3C

RADIO FREQUENCY (RF) PULSING IMPEDANCE TUNING WITH MULTIPLIER MODE

FIELD

Embodiments of the present disclosure generally relate to RF power delivery methods used for processing a substrate.

BACKGROUND

In conventional radio frequency (RF) plasma processing, such as that used during stages of fabrication of many semiconductor devices, RF energy may be provided to a substrate process chamber via an RF energy source. The RF energy may be generated and provided in continuous or pulsed wave modes. Due to mismatches between the impedance of the RF energy source and the plasma formed in the process chamber, RF energy is reflected back to the RF energy source, resulting in inefficient use of the RF energy and wasting energy, potential damage to the process chamber or RF energy source, and potential inconsistency/non-repeatability issues with respect to substrate processing. As such, the RF energy is often coupled to the plasma in the process chamber through a fixed or tunable matching network that operates to minimize the reflected RF energy by more closely matching the impedance of the plasma to the impedance of the RF energy source. The matching network attempts to efficiently couple the output of the RF source to the plasma to maximize the amount of energy coupled to the plasma (e.g., referred to as tuning the RF power delivery). Thus, the matching network attempts to adjust the total impedance (i.e., plasma impedance+chamber impedance+matching network impedance) to be the same as the output impedance of the RF power delivery. In some embodiments, the RF energy source may also be capable of frequency tuning, or adjusting the frequency of the RF energy provided by the RF energy source, in order to assist in impedance matching.

In process chambers that use multiple separate RF power signals pulsed at multiple power levels, synchronized RF pulsing is typically used. However, the inventors have observed that in various RF pulsing schemes, the multiple impedance changes that occur makes impedance tuning difficult. That is, the match network and/or RF generators cannot adequately tune for the reflected power as the reflected power changes.

Accordingly, the inventors have provided improved methods and apparatus for RF pulsing tuning using one or more variable frequency generators in addition to using a variable capacitor/inductor to advantageously minimize RF pulse reflection in process chambers that use multiple separate RF power signals, pulsed at multiple power levels during a single duty cycle.

SUMMARY

Methods and systems for RF pulse reflection reduction are provided herein. In some embodiments, a method for processing a substrate in a plasma enhanced substrate processing system using multi-level pulsed RF power includes; receiving a process recipe for processing the substrate that includes a plurality of pulsed RF power waveforms from a plurality of RF generators, wherein the plurality of RF generators includes a master RF generator and one or more slave RF generators, using the master RF generator to generate a transistor-transistor logic (TTL) signal having a base frequency and a first duty cycle, setting a multiplier for each RF generator, wherein the multiplier is a multiple of the base frequency, dividing the first duty cycle into a high level interval and a low level interval, determining a frequency command set for each RF generator and sending the frequency command set to each RF generator, wherein the frequency command set includes a frequency set point for each RF generator; and providing the plurality of pulsed RF power waveforms from the plurality of RF generators to a process chamber according to the frequency command set sent to each RF generator.

In some embodiments, a non-transitory computer readable medium having instructions stored thereon that, when executed, cause a method of operating a plasma enhanced substrate processing system to be performed, the method including receiving a process recipe for processing the substrate that includes a plurality of pulsed RF power waveforms from a plurality of RF generators, wherein the plurality of RF generators include a master RF generator and one or more slave RF generators, using the master RF generator to generate a TTL signal having a base frequency and a first duty cycle, setting a multiplier for each RF generator, wherein the multiplier is a multiple of the base frequency, dividing the first duty cycle into a high level interval and a low level interval, determining a frequency command set for each RF generator and sending the frequency command set to each RF generator, wherein the frequency command set includes a frequency set point for each RF generator; and providing the plurality of pulsed RF power waveforms from the plurality of RF generators to a process chamber according to the frequency command set sent to each RF generator.

In some embodiments, a substrate processing system includes a plurality of RF generators configured to provide a plurality of RF power waveforms to a process chamber during a first duty cycle, wherein the plurality of RF generators include a master RF generator and one or more slave RF generators, a pulse controller coupled to the plurality of RF generators, at least one match network coupled to each of the plurality of RF generators, the process chamber, and the pulse controller, wherein the at least one match network includes at least one measuring device configured to measure reflected power or impedance for the plurality of RF power waveforms and at least one variable match component, wherein at least one of the pulse controller or the at least one match network is configured to: receive a process recipe for processing the substrate, set a multiplier for at least one of the plurality of RF generators, wherein the multiplier is a multiple of a base frequency of a TTL signal created by the master RF generator, divide a first duty cycle of the TTL signal into a high level interval and a low level interval, determine a frequency command set for each RF generator and send the frequency command set to each RF generator, wherein the frequency command set includes a frequency set point for each RF generator; and provide an RF power waveform from each RF generator to a process chamber according to the frequency command set sent to each RF generator.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, that the appended drawings illustrate only some embodiments of the disclosure and are therefore not to be considered limiting of scope, for the disclosure may admit to other equally effective embodiments.

FIG. 3A-C depicts pulsed waveforms of radio frequency signals in accordance with some embodiments of the present disclosure.

Figure 1:
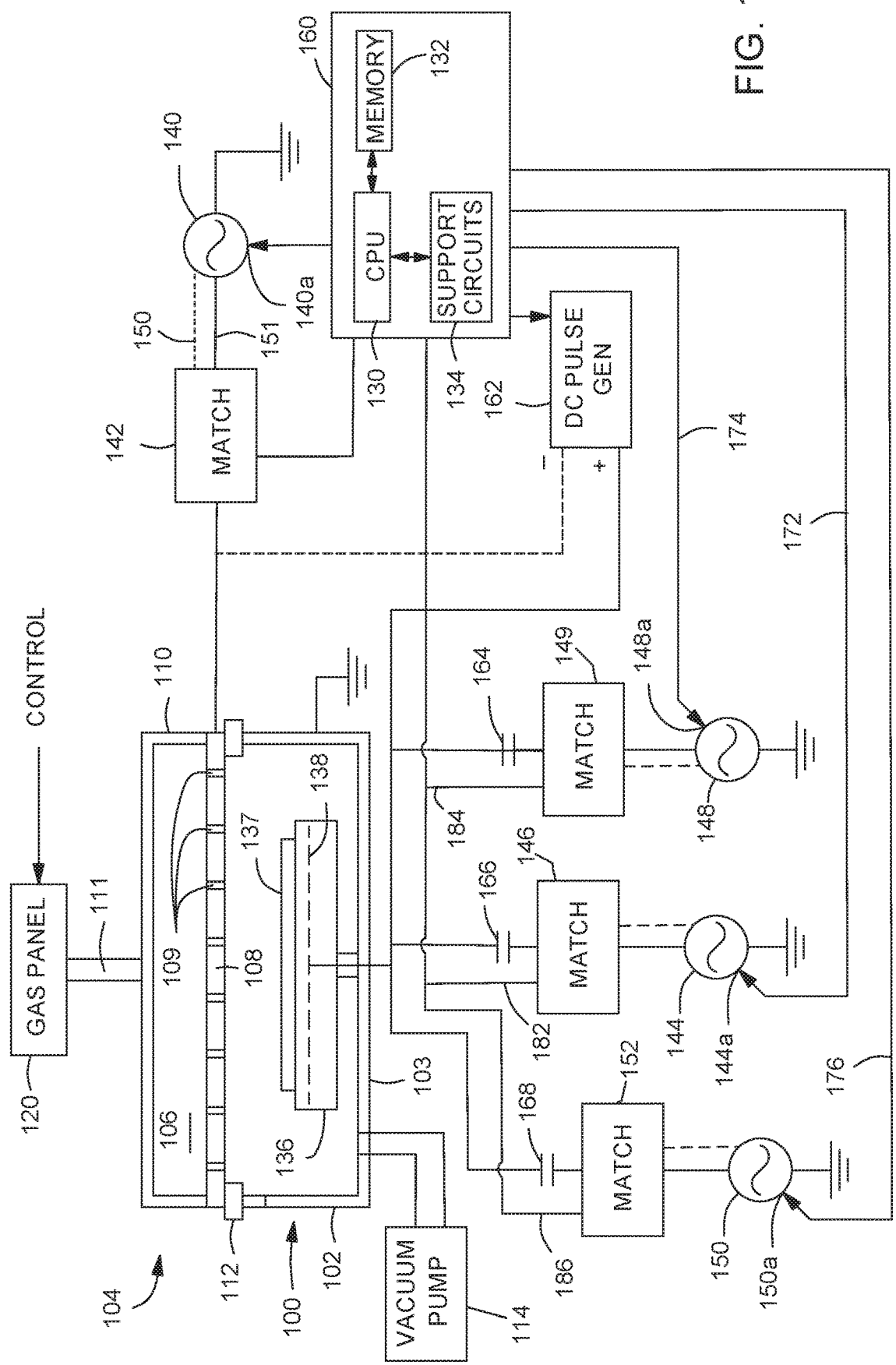
FIG. 1 depicts a plasma reactor in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide improved methods and apparatus for RF pulsing tuning using one or more variable frequency generators in addition to using a variable capacitor/inductor. Specifically, improved methods and apparatus use at least two degrees of tuning freedom to perform impedance matching by using at least one variable capacitor/inductor and one or more variable frequencies produced by one or more variable frequency generators. Since frequencies produced by one or more variable frequency generators can be quickly changed (i.e., at the microsecond level), they can quickly adjust and tune to new impendences produced by changes in total forward power within a single RF pulse cycle. In some embodiments consistent with the present disclosure, an RF match network will send a frequency command set to a RF frequency generator. The RF generator will then create an RF pulse output with a single frequency or multiple frequencies for the single RF pulse cycle to minimize the reflected power for each interval within the single RF pulse cycle. The variable capacitor/inductor will be tuned to a target impedance value calculated. Embodiments consistent with the present disclosure advantageously minimizes RF pulse reflection in process chambers that use multiple separate RF power signals, pulsed at multiple power levels during a single duty cycle by using one or more variable frequency generators in addition to using one or more variable capacitors/inductors.

FIG. 1 depicts a plasma reactor which may be utilized to perform the methods disclosed herein. The methods may be performed in a capacitively coupled plasma reactor (e.g., as illustrated in FIG. 1) or any other suitable plasma reactor, such as an inductive coupled plasma reactor. However, the inventors have observed that the methods can be particularly beneficial in capacitively coupled plasma reactors, such as where high bias power (e.g., about 2000 W or more) and low source power (e.g., about 500 W or less) is used, as undesired charging effects can be much more severe than, for example, in inductively coupled plasma processing chambers. In some embodiments, the inventors have discovered that the present methods provide particular benefit in configurations where at least one of a DC bias ($V_{DC}$), a $V_{RF}$, or a plasma sheath voltage are at or above about 1000V.

The reactor of FIG. 1 includes a chamber 100 enclosed by a cylindrical side wall 102, a floor 103, and a lid 104. In some embodiments, the lid 104 may be a gas distribution showerhead including a gas manifold 106 overlying a gas distribution plate 108 having orifices 109 formed through the gas distribution plate 108. The gas manifold 106 is enclosed by a manifold enclosure 110 having a gas supply inlet 111. The gas distribution showerhead (i.e., lid 104) is electrically insulated from the cylindrical side wall 102 by an insulating ring 112. A vacuum pump 114, such a turbomolecular pump, is capable of evacuating the chamber 100. A gas panel 120 controls the individual flow rates of different process gases to the gas supply inlet 111. A support pedestal 136 supported through the floor 103 of the chamber may have an insulating top surface and an internal electrode (wafer support electrode 138). The internal electrode may, for example, be used for chucking a substrate 137 on the top surface of the support pedestal 136.

Power may be applied to the chamber 100 from a plurality of RF generators 140, 144, 148, and 150. The plurality of RF generators 140, 144, 148, and 150 includes a master RF generator 140 and one or more slave RF generators 144, 148, and 150. Plasma source power is applied to the lid 104 (also referred to herein as a gas distribution showerhead) from a master RF generator 140 through an impedance matching network 142. The lid or gas distribution showerhead is formed of a conductive material, such as aluminum for example, and therefore serves as a lid electrode. In some embodiments, the master RF generator 140 may generate VHF power in the high portion of the VHF spectrum, such as in a range of 100 to 200 MHz. The master RF generator 140 has the capability of pulsing the power generated at a desired pulse rate and duty cycle. For example, the master RF generator 140 has a pulse control input 140a for receiving a control signal or signals defining the pulse rate and/or duty cycle as well as the phase of each pulse produced by the master RF generator 140.

In the embodiment shown in FIG. 1, plasma bias power or plasma source power is applied to the wafer support electrode 138 from a first slave RF generator 144 through an impedance matching network 146, a second slave RF generator 148 through an impedance matching network 149, and a third slave RF generator 150 through an impedance matching network 152. For example, the first slave RF generator 144 may apply plasma source power while the second slave RF generator 148 and the third slave RF generator 150 may apply plasma bias power. The one or more slave RF generators 144, 148, 150 may generate high frequency (HF) or low frequency (LF) power in the LF spectrum to a low portion of the HF spectrum, such as in a range of 30 kHz to 5 MHz. For example, the first slave RF generator 144, the second slave RF generator 148, and the third slave RF generator 150 may generate power at about 2 MHz, about 400 kHz, and about 100 kHz, respectively. The one or more slave RF generators 144, 148, 150 have the capability of pulsing the power generated at a desired pulse rate and duty cycle. For example, the one or more slave RF generators 144, 148, 150 have pulse control inputs 144a, 148a, 150a for receiving a control signal or signals defining the pulse rate and/or duty cycle as well as the phase of each pulse produced by the one or more slave RF generators 144,148, 150. The one or more slave RF generators 144, 148, 150 may be independently pulsed, phased, and/or duty cycle controlled. Further, the one or more slave RF generators 144, 148, 150 may be pulsed synchronously or asynchronously.

In some embodiments, the impedance matching networks 142, 146, 149, and 152 may be formed by one or more capacitors and/or an inductor. The values of capacitor may be electronically or mechanically tuned to adjust the matching of each of the impedance matching networks 142, 146, 149 and 152. In lower power systems, the one or more capacitors may be electronically tuned rather than mechanically tuned. In some embodiments, the impedance matching networks 142, 146, 149, and 152 may have a tunable inductor. In some embodiments, one or more of the capacitors used in the impedance matching networks 142, 146, 149, and 152 may be one or more fixed capacitors or series capacitors. In other embodiments, one or more of the capacitors used in the impedance matching networks 142, 146, 149, and 152 may be a variable capacitor, which may be electronically or mechanically tuned to adjust the matching of the impedance matching networks 142, 146, 149 and 152. In some embodiments, one or more of the impedance matching networks 142, 146, 149, and 152 may have a capacitive shunt to ground.

Figure 2:
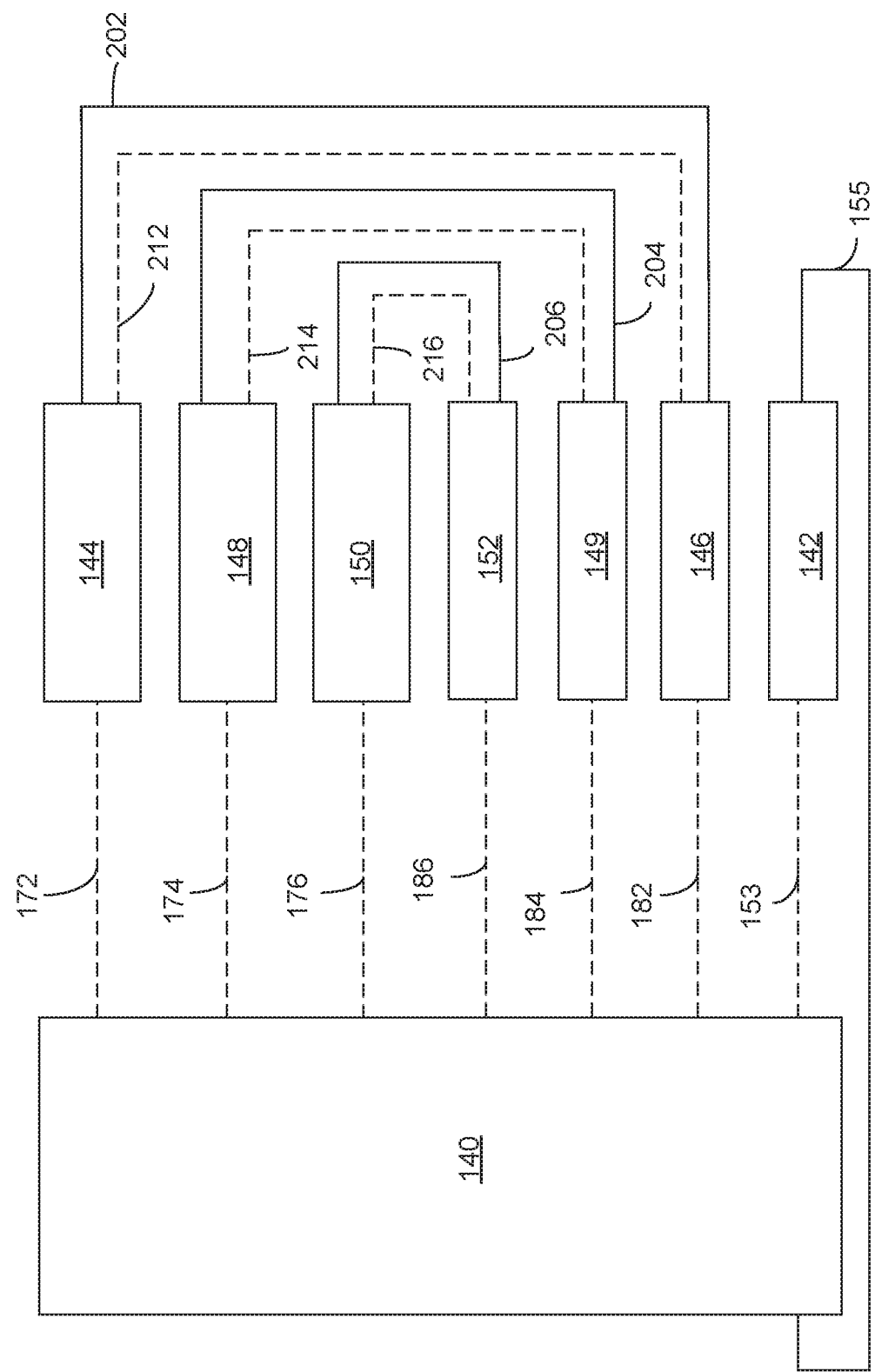
FIG. 2 depicts a wiring diagram of a master RF generator and one or more slave RF generators in accordance with some embodiments of the present disclosure.

FIG. 2 depicts a wiring diagram of a master RF generator and one or more slave RF generators in accordance with the embodiment shown in FIG. 1. The master RF generator 140 may be connected to the impedance matching network 142 via high speed link cable 153 and RF cable 155. The master RF generator 140 may be connected to the first slave RF generator 144 via high speed link cable 172. The master RF generator 140 may be connected to the second slave RF generator 148 via high speed link cable 174. The master RF generator 140 may be connected to the third slave RF generator 150 via high speed link cable 176. The master RF generator 140 may be connected to the impedance matching networks 142, 146, and 152, via high speed link cables 153, 182, and 184, respectively.

The first slave RF generator 144 may be connected to the impedance matching network 146 via RF cable 202 and high speed link cable 212. The second slave RF generator 148 may be connected to the impedance matching network 149 via RF cable 204 and high speed link cable 214. The third slave RF generator 150 may be connected to the impedance matching network 152 via RF cable 206 and high speed link cable 216.

Figure 6:
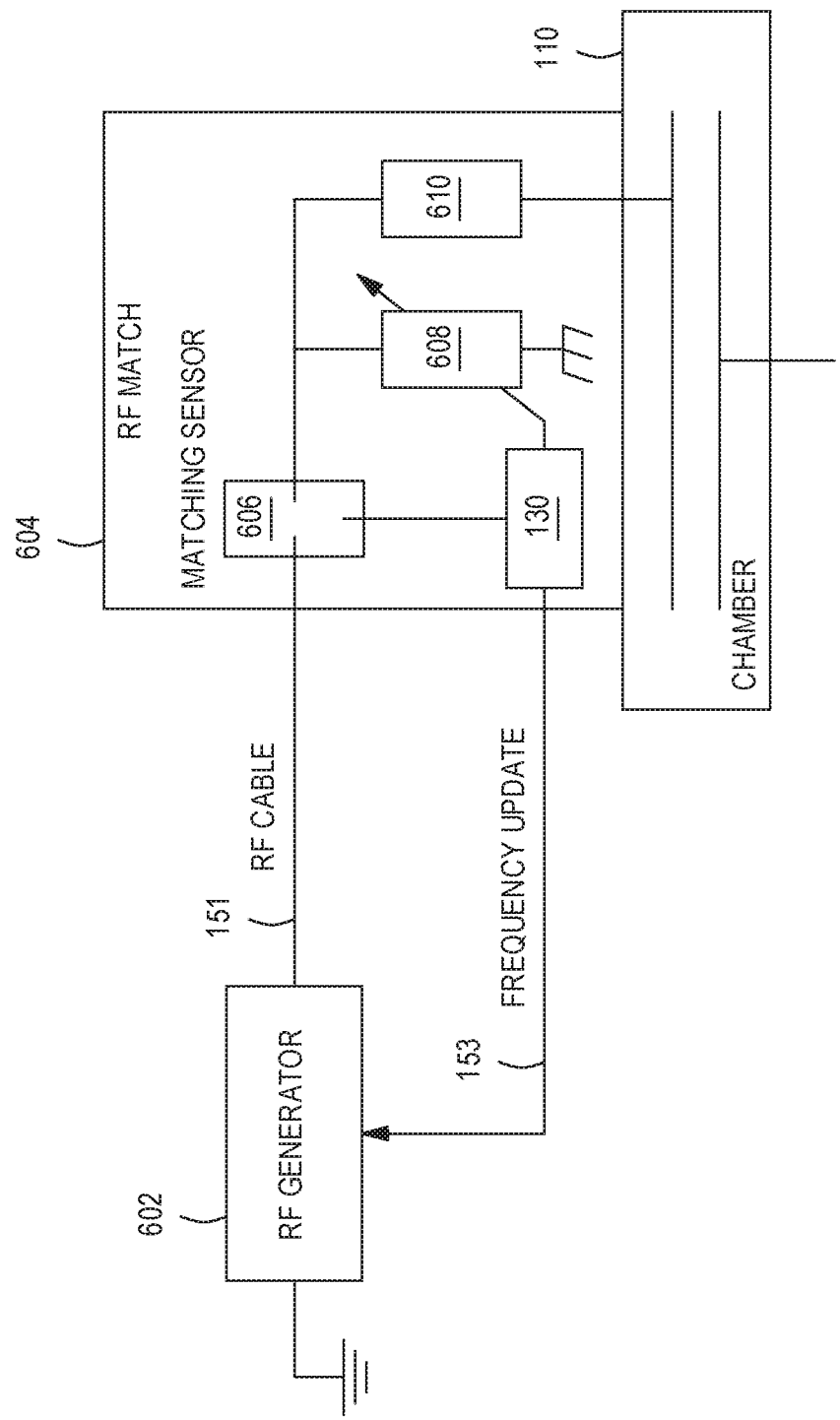
FIG. 6 depicts an exemplary apparatus for employing a tuning algorithm in accordance with some embodiments of the present disclosure.

The above described impedance matching networks are illustrative only and other various configurations of impedance matching networks having one or more adjustable elements for tuning the matching network may be utilized and tuned in accordance with the teachings provided herein. For example, FIG. 6 depicts an exemplary apparatus for employing the smart tuning algorithm in accordance with some embodiments of the present disclosure. RF generator 602 is a schematic representation of the plurality of RF generators 140, 144, 148, and 150 of FIG. 1.

In FIG. 6, the RF generator 602 may be connected to a RF matching network 604 via RF cables 151 and one or more high speed link cables 153. RF matching network 604 is a schematic representation of one or more impedance matching networks 142, 146, 149, 152. The RF matching network 604 may include one or more matching sensors or impedance measuring devices (e.g., VI probe/sensor 606), a CPU 130, a variable impedance matching component 608 (e.g., a variable capacitor/inductor), and a fixed component $Z_2$ 610 (e.g., a fixed capacitor/inductor. The variable impedance matching component 608 may include one or more variable capacitors and/or inductors to provide the desired impedance matching. A plurality of series cables may be used to supply the timing signals to the RF generator(s) 602 and the RF matching network 604. Thus, in the above-described configuration, the reflected power can be reduced/minimized (i.e., the system can be tuned) by tuning the variable impedance matching component 608 to a target impedance calculated, as discussed below, and varying the frequency/power provided by the generators to provide two (2) degrees of tuning freedom (i.e., variable impedance matching component 608 and variable frequency).

A controller 160 is programmable to apply pulse control signals to each of the pulse control inputs 140*a*, 144*a*, 148*a*, 150*a* of the plurality of RF generators 140, 144, 148, 150 to produce the desired phase lead or lag relationship and/or duty cycle relationship among the pulses of the master RF generator 140 and the slave RF generators 144, 148, 150. The controller 160 may also control other aspect of the tool/process chamber. Although shown as a separate component in FIG. 1, in some embodiments, the controller 160 can be disposed internally inside of each RF generator. Synchronization signals would be generated at a master RF generator (e.g., master RF generator 140), and sent to other slave generators (e.g., slave RF generators 144, 148, and/or 150).

In some embodiments, the RF generators 140, 144, 148, and 150, the impedance matching networks 142, 146, 149, and 152, and/or the controller 160 comprise a central processing unit (CPU) 130, a plurality of support circuits 134, and a memory 132. While the present exemplary embodiments of the plurality of RF generators 140, 144,148, and 150, the impedance matching networks 142, 146, 149, and 149 and controller 160 are discussed with respect to a computer having a CPU, support circuits, and a memory, one of ordinary skill in the art would recognize that the plurality of RF generators 140, 144, 148, and 150, the impedance matching networks 142, 146, 149, and 152, and controller 160 could be implemented in a variety of ways, including as an application specific interface circuit (ASIC), a field-programmable gate array (FPGA), a system-on-a-chip (SOC), and the like. Various embodiments of the controller 160 may also be integrated within other process tool controllers, with corresponding input/output interfaces as known in the art.

The support circuits 134 may include a display device as well as other circuits to support the functionality of the CPU 130. Such circuits may include clock circuits, cache, power supplies, network cards, video circuits and the like The memory 132 may comprise read only memory, random access memory, removable memory, disk drives, optical drives and/or other forms of digital storage. The memory 132 is configured to store an operating system, and a sub-fab control module. The operating system executes to control the general operation of the plurality of RF generators 140, 144, 148, and 150, the impedance matching networks 142, 146, 149, and 152, and controller 160, including facilitating the execution of various processes, applications, and modules to control the one or more RF generators 140, 144, 148, and 150 or the impedance matching networks 142, 146, 149, and 152 in order to perform the methods discussed here (e.g., method 600 discussed below).

Further, a DC generator 162 may be coupled to either (or both) the wafer support electrode 138 and the lid 104. In some embodiments, DC generator 162 may supply continuous and/or variable DC. In some embodiments, DC generator 162 may provide pulsed DC power. The pulse repetition rate, phase and duty cycle of the DC generator are controlled by the controller 160. A DC isolation capacitor 164, 166, 168 may be provided to isolate each RF generator 148, 144, 150, respectively, from the DC generator 162. A DC signal generated by the DC generator may be synchronized with the RF signals generated by the RF generators 140, 144, 148, and 150 to provide benefits such as reduced charge-up on a substrate 137 or improved etch rate control of the substrate using a plasma formed in the plasma reactor.

FIG. 3A depicts a time domain waveform diagram that may reflect the pulsed RF output of each of the plurality of RF generators 140, 144, 148, 150 showing the pulse envelope of the pulsed RF output, characterized by the following parameters controlled by the controller 160 individually for each RF generator 140, 144, 148, 150: a pulse duration $t_P$, a pulse "on" time $t_{ON}$, a pulse "off" time $t_{OFF}$, a pulse frequency $1/t_P$, and a pulse duty cycle $(t_{ON}/t_P) \cdot 100$ percent. The pulse duration $t_P$ is the sum of $t_{ON}$ and $t_{OFF}$.

FIGS. 3B and 3C depict contemporaneous time domain waveforms of two RF pulsed signals synchronized together in such a manner that they have identical phase and duty cycle and therefore a phase difference of zero between them. The exemplary embodiment depicted in FIGS. 3B and 3C is one exemplary form of synchronization between a first pulsed RF signal (e.g., a pulsed master signal) and a second pulsed RF signal (e.g., a pulsed slave signal). As shown, both the phase and duty cycle of each pulsed signal is the same.

Figure 4A:
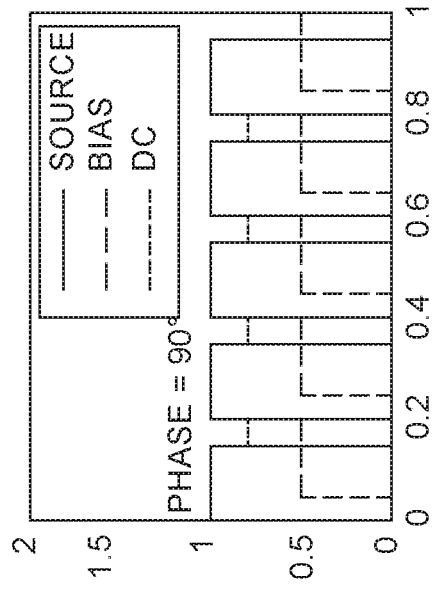
FIG. 4A-D depicts phase variance between pulsed waveforms in accordance with some embodiments of the present disclosure.
Figure 4B:
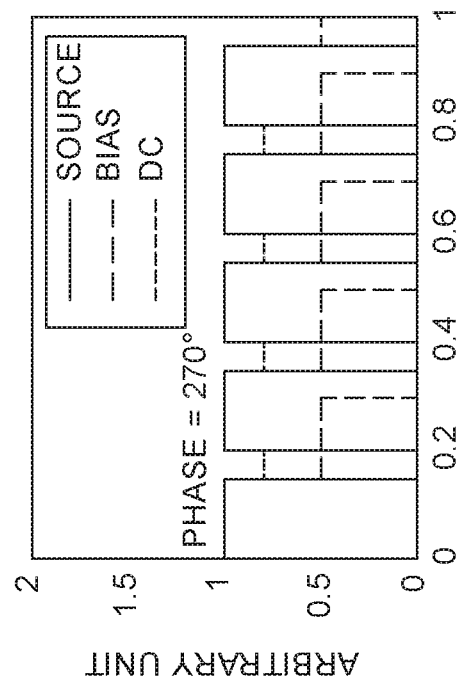
Figure 4C:
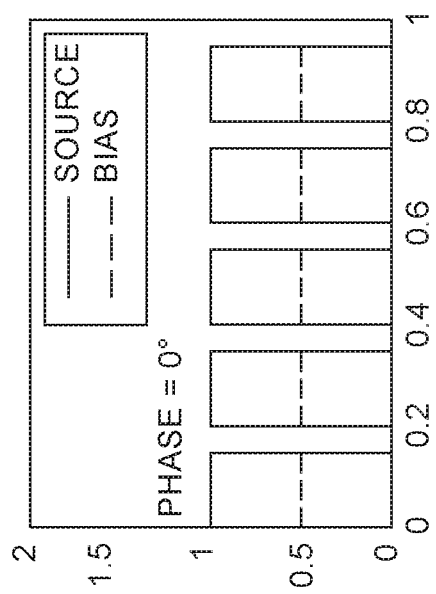
Figure 4D:
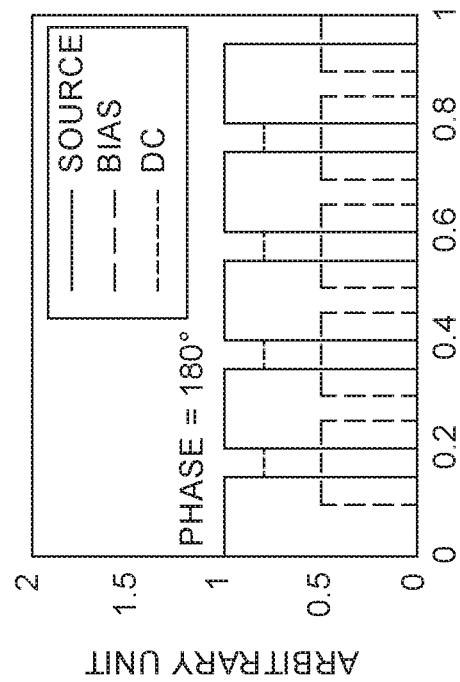

In some embodiments of the present disclosure, the pulsed signals provided by the plurality of RF generators 140, 144, 148, and 150 are varied in phase. FIGS. 4A through 4D illustrate how the phase difference may be varied by the controller 160, and depict the superposition of the source, or master, and bias, or slave, power waveforms at phase differences of 0°, 90°, 180° and 270°, respectively, where the phase difference is defined by how much the second pulse output lags the first pulse output. FIG. 4A corresponds to the example of zero phase difference of FIG. 3B. FIG. 4B depicts a case in which the bias power pulse output lags the source power pulse output by 90°. FIG. 4C depicts a case in which the bias power pulse output lags the source power pulse output by 180 degrees. FIG. 4D depicts a case in which the bias power pulse output lags the source power pulse output by 270°. Although FIGS. 4A-4B only depict two pulsed RF signals with varying phase, in embodiments consistent with the present disclosure can also include three or more pulsed RF signals with varying phases.

In some embodiments, etching rates may be enhanced while pulsing the plasma by controlling the phase lead or lag of the RF envelopes. When the source and bias are pulsed independently out-of-phase, or with varying duty cycle, the different plasma dynamics of the very high frequency (VHF) and low frequency (LF) allow for better plasma fill over the entire pulse. In some embodiments, a combination of VHF of about 162 MHz source frequency is used in conjunction with a first bias frequency of about 2 MHz a second bias frequency of about 400 kHz, and a third bias frequency of about 100 kHz.

Figure 5:
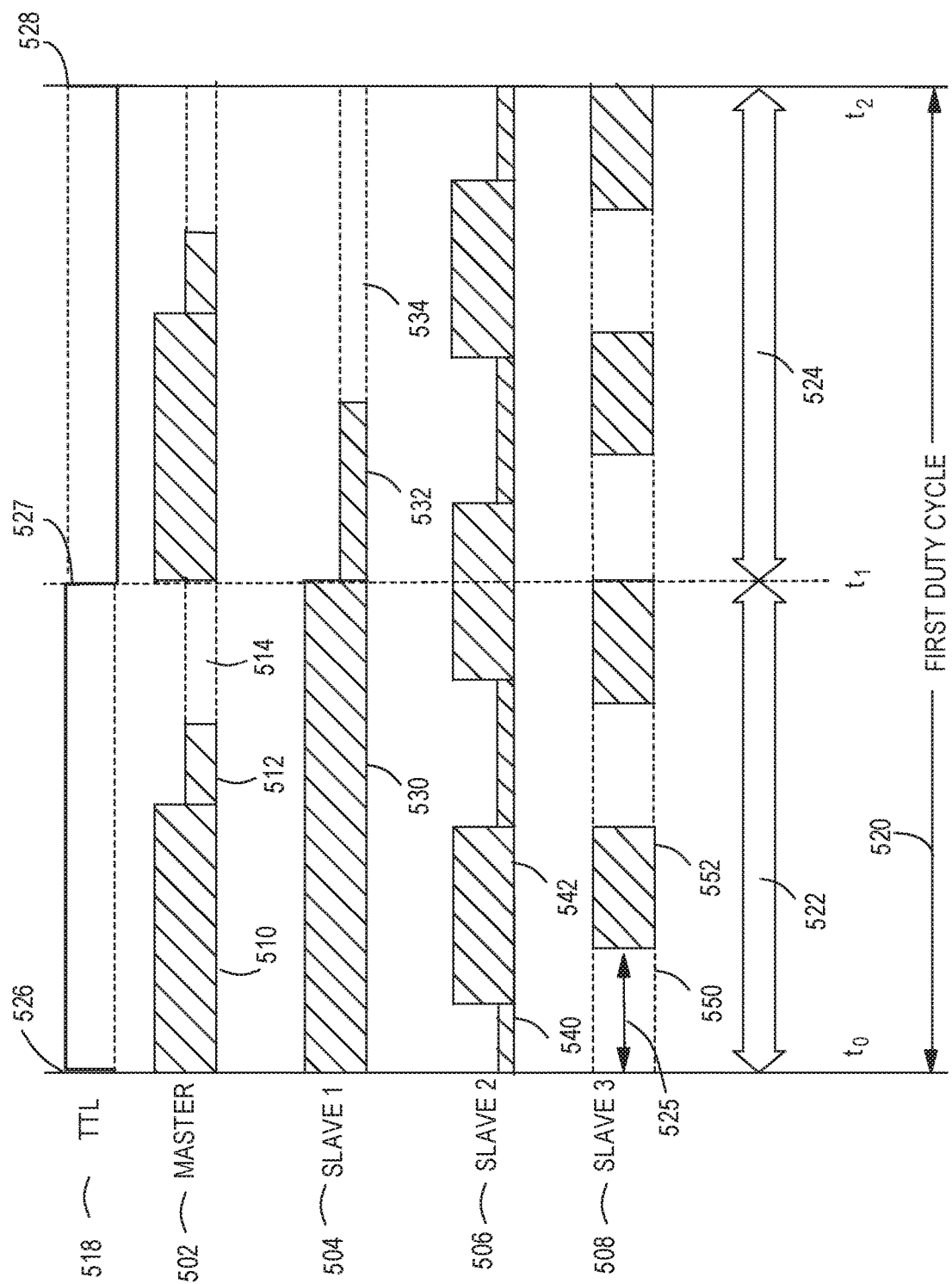
FIG. 5 depicts multiple pulsed power waveforms for a first duty cycle in accordance with some embodiments of the present disclosure.

The master RF generator 140 can generate a transistor-transistor logic (TTL) signal having a base frequency and a first duty cycle. FIG. 5 depicts the first duty cycle of a pulsed RF power associated with a substrate processing recipe to process a substrate. In the example shown in FIG. 5, the substrate processing recipe calls for four separate pulsed RF waveforms to be provided in order to process the substrate. FIG. 5 depicts multiple separate RF power signals that may be provided continuously or pulsed at multiple power levels in accordance with some embodiments of the present disclosure. FIG. 5 depicts a Multi-Stroke Cycle Pulse (MSCP) using multi-level pulsing (MLP) for multi-frequency RF mixing. In some embodiments, single level pulsing (SLP) (i.e., an on/off pulse wave form) and continuous waveforms (CW) may be used. In some embodiments, dual level pulsing (DLP) (i.e., a high power/low power pulse wave form) may be used. In some embodiments, triple level pulsing (TLP) (i.e., a high power/low power/off pulse wave form) may be used.

In FIG. 5, four separate RF power waveforms are shown, a master RF power waveform 502, a first slave RF power waveform 504, a second slave RF power waveform 506, and a third slave RF power waveform 508. As shown, the master RF power waveform 502 has a TLP waveform, the first slave RF power waveform 504 has a TLP waveform, the second slave RF power waveform 506 has a DLP waveform, and the third slave RF power waveform 508 has a SLP waveform.

Each of the four RF power waveforms 502, 504, 506, and 506 that are separate may be provided at multiple power levels independently and out-of-phase with each other, or with varying duty cycle consistent with embodiments of the present disclosure. The RF power waveforms 502, 504, 506, and 508 may be provided by one or more of source and bias RF generators (e.g. the plurality of RF generators 140, 144, 148, and 150). In embodiments where there are two or more pulsed RF power waveforms, the separate pulsed RF power waveforms may be pulsed synchronously with each other. In some embodiments, the separate RF power waveforms may be pulsed asynchronously.

Each of the four separate RF power waveforms may be set to pulse at a frequency that is an integer multiple of the base frequency of the TTL signal. In some embodiments, such as in a standard multiplier mode, all of the slave RF power waveforms have the same pulse frequency. In some embodiments, such as in a universal multiplier mode, each slave RF power waveform may the same or different pulse frequencies. The master RF power waveform 502 may have a multiplier of one (i.e. the same frequency as the base frequency of the TTL signal). In FIG. 5, the master RF power waveform 502 has a multiplier of two (i.e. the master RF power waveform is pulsed at a frequency that is two times the base frequency of the TTL signal). The first slave RF power waveform 504 has a multiplier of one. The second slave RF power waveform 506 has a multiplier of three. The third slave RF power waveform 508 has a multiplier of four.

In FIG. 5, the TTL signal is introduced at time $t_0$ and has a first duty cycle 520. The first duty cycle 520 may be divided into a high level interval 522 and a low level interval 524. The high level interval 522 corresponds with a rise 526 and a fall 527 of the TTL signal. The low level interval 524 corresponds with the fall 527 and a subsequent rise 528 of the TTL signal. The master RF power waveform 502 may be introduced at time $t_0$ and may comprise a first power pulse 510 at a first power level and a second power pulse 512 at a second power level, and a third power pulse 514 at a zero power level.

In some embodiments, the frequency of the master RF power waveform 502 may be about 2 MHz to about 200 MHz. In some embodiments, the power level of the master RF power waveform 502 may be about 200 watts to about 5.0 KW (e.g., 3.6 KW). If the master RF power waveform 502 is pulsed, the value of the second power level may be about 0-100% of the first power level. In other embodiments, the second power level may be greater than the first power level.

The first slave RF power waveform 504 may also be introduced at time $t_0$ (as shown) or after a delay period 525. The first slave RF power waveform 504 may comprise a first power pulse 530 at a first power level, a second power pulse 532 at a second power level, and a third power pulse 534 at a third power level. As illustrated in FIG. 5, the first power pulse 530 precedes the second power pulse 532 and the third power pulse 534. If desired, additional power pulses may be provided in that order, or in a different order. As shown in FIG. 5, the first power pulse 530 may be provided at a high power level, the second power pulse 532 may be provided at a low power level that is lower than the first power pulse 530, and the third power pulse 534 may be provided at a zero power level. In some embodiments, the length of each of the time periods that each power pulse 530, 532, and 534 is applied may be different from each other. In other embodiments, the length of each of the time periods that each power pulse 530, 532, and 534 is applied may be equivalent to each other. In some embodiments, the first slave RF power waveform 504 may be provided at a frequency of about 1 MHz to about 3 MHz. In other embodiments, other frequencies as described above may be used.

The second slave RF power waveform 506 may also be introduced at time $t_0$ (as shown) or after a delay period 525. In some embodiments, the second slave RF power waveform 506 may comprise similar features as described above with respect to the master RF power waveform 502 and/or the first slave RF power waveform 504. In some embodiments, the second slave RF power waveform 506 may comprise a first power pulse 540 at a first power level and a second power pulse 542 at a second power level. As shown in FIG. 5, the first power pulse 540 may be provided at a low power level, and the second power pulse 532 may be provided at a high power level that is higher than the first power level 540.

The third slave RF power waveform 508 may also be introduced at time $t_0$ or after a delay period 525 (as shown). In some embodiments, the third slave RF power waveform 506 may comprise similar features as described above with respect to the master RF power waveform 502, the first slave RF power waveform 504, or the second slave RF power waveform 506. In some embodiments, the third slave RF power waveform 508 may comprise a first power pulse 550 at a first power level and a second power pulse 552 at a second power level. As shown in FIG. 5, the first power pulse 550 may be provided at a zero power level and the second power pulse 552 may be provided at a high power level.

In some embodiments, the duty cycles of the separate RF power waveforms, are synchronized. In some embodiments, the TTL signal may be a timing signal provided by the DC generator 162.

In FIG. 5, a high level interval 522 and a low level interval 524 is provided. The CPU 130 is configured to calculate a high average impedance value, which is an average impedance value across the high level interval. The CPU is configured to calculate a low average impedance value, which is an average impedance value across the low level interval. The CPU 130 is configured to calculate a target impedance value based on the calculated high and low average impedance values. In some embodiments, the target impedance value is an average of the high and low average impedance values. In some embodiments, the target impedance value is closer to the high average impedance value than the low average impedance value. In some embodiments, the target impedance value is closer to the low average impedance value than the high average impedance value. The one or more RF match networks are configured to tune to the target impedance to advantageously minimize the average reflected power. At each new duty cycle of the TTL signal, the system tunes to compensate for the new reflected power based on the total forward power provided.

In order to minimize the reflected power further, the inventors have developed a method that utilizes the apparatus describe above which tunes the plurality of RF power waveforms faster to minimize the average reflected power using the method shown in FIG. 6 and described below. In embodiments consistent with the present disclosure, method 600 may be performed by one or more RF matching network 604, one or more RF generator 602, or controller 160.

The method 700 begins at 702, where a process recipe for processing a substrate is received. The process recipe includes a plurality of pulsed RF power waveforms (i.e., 502, 504, 506, and 508) from a plurality of RF generators 140, 144, 148, and 150. The plurality of RF generators includes a master RF generator 140 and one or more slave RF generators 144, 148, and 150. At 704, the master RF generator 140 can be used to generate a TTL signal having a base frequency and a first duty cycle. At 706, a multiplier is set for each of the plurality of RF generators 140, 144, 148, and 150. In some embodiments, a multiplier is set for at least one of the plurality of RF generators 140, 144, 148, and 150. The multiplier is an integer. At 708, the first duty cycle is divided into a high level interval 522 and a low level interval 524. The high level interval 522 corresponds with a duration of a detected rise of a TTL signal and a detected fall of the TTL signal. The low level interval 524 corresponds with a duration of a detected fall of the TTL signal and a detected subsequent rise of the TTL signal. In some embodiments, the CPU 130 is capable of receiving TTL rise and TTL fall timings.

At 710, a frequency command set for each RF generator is determined, where the frequency command set includes a frequency set point. In some embodiments, the frequency command set is determined by an RF match network (e.g., RF matching network 604). The frequency command set includes the frequency and/or power set points for the first duty cycle. In some embodiments, the frequency command set is sent to the RF generator by the RF match network indirectly via a controller (e.g., controller 160) communicatively coupled to the RF match network and the RF generator. The determined frequency command set for each of RF generators 140, 144, 148, and 150 is sent to the corresponding RF generators 140, 144, 148, and 150 associated with the frequency command set. In some embodiments, the frequency command set may be sent to the respective generators via high speed link cables 153, 212, 214, 216. In other embodiments, the frequency command set may be sent to the respective generators via the controller 160.

Determining the frequency command set may include the CPU 130 calculating a high average impedance value across the high level interval and a low average impedance value across the low level interval. The CPU 130 may then calculate a target impedance based on the high average impedance value and the low average impedance value. The one or more RF match networks may be tuned to the target impedance using variable match components (e.g. a variable capacitor/inductor) disposed within the one or more RF match networks. The variable impedance matching component includes at least one of a variable capacitor or inductor.

Figure 7:
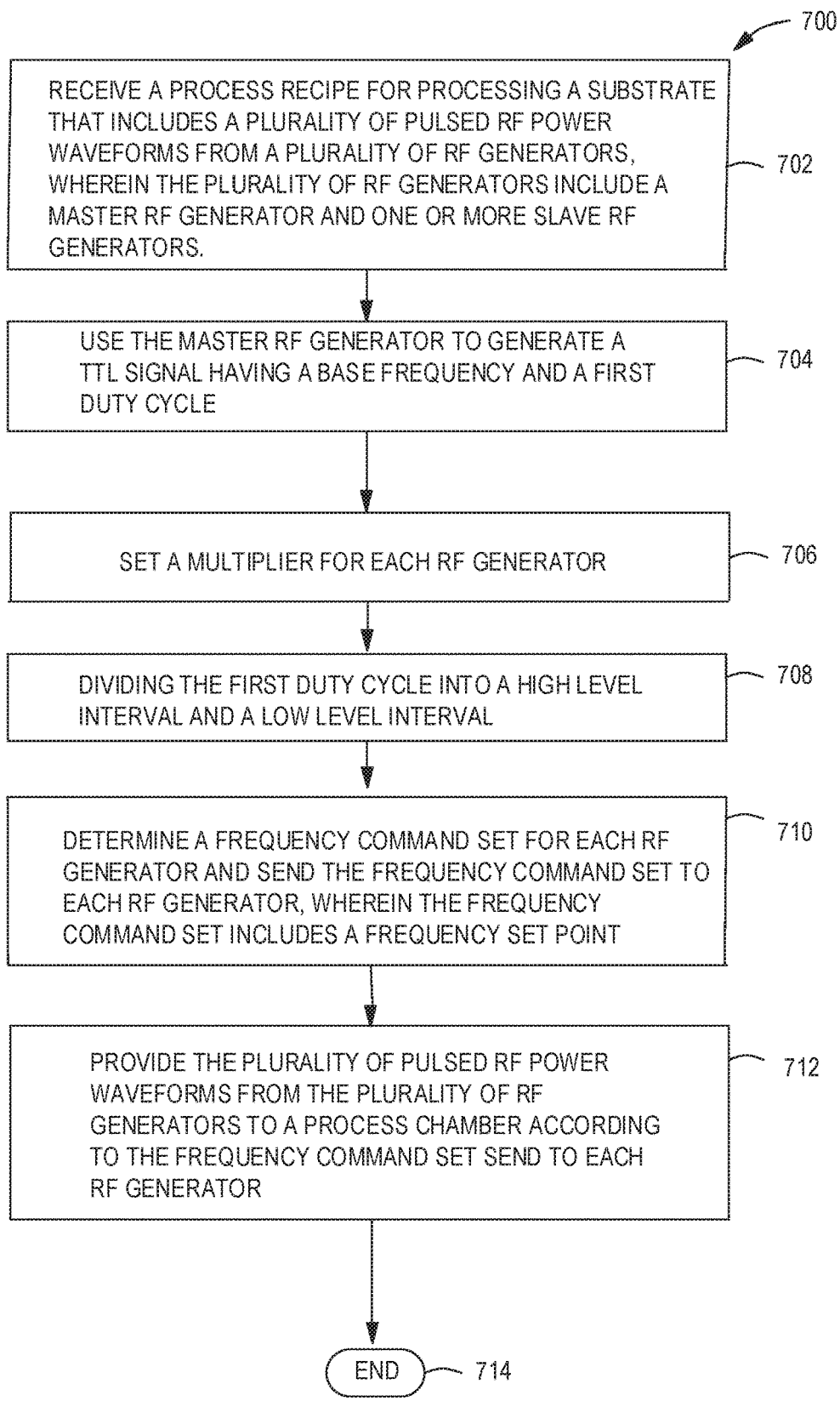
FIG. 7 depicts a flow chart of a method for RF pulse reflection reduction in process chambers in accordance with some embodiments of the present disclosure.

In some embodiments, each of the variable impedance matching components 608 in the impedance matching network 142, 146, 149, and 152 are tuned to the same target impedance value calculated. FIG. 7 describes the processing that occurs during a single duty cycle, which may be repeated as necessary to process the substrate. In some embodiments consistent with the present disclosure, the process recipe may include the RF pulse power waveforms for all duty cycles, which may not always be identical to each other in terms of frequency and power at each interval. Thus, each individual duty cycle may be separately analyzed and divided as described above.

At 712, the plurality of pulsed RF power waveforms (e.g., 502, 504, 506, and 4508) from the plurality of RF generators is provided to the process chamber according to the frequency command set sent to each generator during the first duty cycle. That is, the RF pulse power will be provided at the frequency set point determined at 710. In some instances, no adjustment will be necessary if the previous set point for a previous time interval is equal to that of the set point in the subsequent time interval, unless there was an adjustment to the frequency to reduce the reflected power based on the measured values as will be described below.

After 712, the impedance/reflected power is measured at each RF matching network 604 by matching sensor 606. The frequency and/or power provided by one of more of the RF generators may be adjusted to further reduce the reflected power based on the impedance measured after 712. These micro frequency adjustments can be sent via high speed link cables 153,212, 214, 216. The method repeats and returns to 712 to provide the RF pulse power waveform at the beginning of a subsequent time interval, measure the reflected/ power impedance, and adjust the frequency/power until processing of the substrate is complete, at which point the method ends at 714.

The method 700 is executed by one or more processors of a plasma reactor, e.g., processors of one or more of the impedance matching networks (i.e., matches), processors of one or more of RF generators, a processor of pulse controller, etc. Examples of a processor include an application specific integrated circuit (ASIC), a programmable logic device (PLD), a microprocessor, a microcontroller, a central processing unit (CPU), etc.

The disclosed embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on non-transitory computer-readable medium. The computer-readable medium is any data storage that can store data, which can be thereafter be read by a computer system. Examples of the computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. The computer-readable medium can include computer-readable tangible medium distributed over a network-coupled computer system so that the computer-readable code is stored and executed in a distributed fashion.

While the foregoing is directed to embodiments of the present disclosure, other and further embodiments of the disclosure may be devised without departing from the basic scope thereof.

The invention claimed is:

1. A method for processing a substrate in a plasma enhanced substrate processing system using multi-level pulsed RF power, comprising:
   receiving a process recipe for processing the substrate that includes a plurality of pulsed RF power waveforms from a plurality of RF generators, wherein the plurality of RF generators includes a master RF generator and one or more slave RF generators;
   using the master RF generator to generate a transistor-transistor logic (TTL) signal having a base frequency and a first duty cycle;
   setting a multiplier for each RF generator, wherein the multiplier is a multiple of the base frequency;
   dividing the first duty cycle into a high level interval and a low level interval;
   determining a frequency command set for each RF generator by calculating a target impedance based on average impedance values and tuning one or more RF match networks to the target impedance and sending the frequency command set to each RF generator, wherein the frequency command set includes a frequency set point for each RF generator; and
   providing the plurality of pulsed RF power waveforms from the plurality of RF generators to a process chamber according to the frequency command set sent to each RF generator.

2. The method of claim 1, wherein calculating the target impedance includes:
   calculating a high average impedance value across the high level interval and a low average impedance value across the low level interval; and
   calculating a target impedance based on the high average impedance value and the low average impedance value.

3. A method for processing a substrate in a plasma enhanced substrate processing system using multi-level pulsed RF power, comprising:
   receiving a process recipe for processing the substrate that includes a plurality of pulsed RF power waveforms from a plurality of RF generators, wherein the plurality of RF generators includes a master RF generator and one or more slave RF generators;
   using the master RF generator to generate a transistor-transistor logic (TTL) signal having a base frequency and a first duty cycle;
   setting a multiplier for each RF generator, wherein the multiplier is a multiple of the base frequency;
   dividing the first duty cycle into a high level interval and a low level interval;
   determining a frequency command set for each RF generator and sending the frequency command set to each RF generator, wherein the frequency command set includes a frequency set point for each RF generator, and wherein determining the frequency command set includes:
      calculating a high average impedance value across the high level interval and a low average impedance value across the low level interval;

calculating a target impedance based on the high average impedance value and the low average impedance value;

tuning one or more RF match networks to the target impedance; and adjusting a frequency or power provided by at least one of the plurality of RF generators to reduce at least one of the high average impedance value or the low average impedance value; and providing the plurality of pulsed RF power waveforms from the plurality of RF generators to a process chamber according to the frequency command set sent to each RF generator.

4. The method of claim 3, wherein tuning one or more RF match networks to the target impedance includes tuning a variable match component disposed within the one or more RF match networks to the target impedance.

5. The method of claim 4, wherein the variable match component that is tuned to the target impedance includes at least one of a variable capacitor or inductor.

6. The method of claim 1, wherein the high level interval corresponds with a duration of a detected rise and a detected fall of the TTL signal.

7. The method of claim 1, wherein the low level interval corresponds with a duration of a detected fall and a detected rise of the TTL signal.

8. The method of claim 1, wherein the frequency command set is determined by an RF match network associated with each RF generator.

9. The method of claim 8, wherein the frequency command set is sent to each RF generator via a high speed link cable that directly and communicatively couples the RF match network and each RF generator.

10. The method of claim 8, wherein the frequency command set is sent to each RF generator by the RF match network indirectly via a controller communicatively coupled to the RF match network and each RF generator.

11. The method of claim 1, further comprising:
receiving a timing signal from the master RF generator to synchronize the plurality of RF power waveforms from the one or more slave RF generators.

12. The method of claim 1, wherein the multiplier for each RF generator can be set independently.

13. The method of claim 1, wherein at least one of the plurality of RF power waveforms is a triple level pulsing (TLP) waveform pulsed at multiple power levels.

14. A non-transitory computer readable medium having instructions stored thereon that, when executed, cause a method of operating a plasma enhanced substrate processing system to be performed, the method comprising the method of claim 1.

15. The non-transitory computer readable medium of claim 14, wherein calculating the target impedance includes:
calculating a high average impedance value across the high level interval;
calculating a low average impedance value across the low level interval; and
calculating a target impedance based on the high average impedance value and the low average impedance value.

16. The non-transitory computer readable medium of claim 15, wherein the method performed further comprises:
tuning variable match components in one or more RF match networks to the target impedance.

17. The non-transitory computer readable medium of claim 16, wherein the variable match components that are tuned to the target impedance includes at least one of a variable capacitor or inductor.

18. The non-transitory computer readable medium of claim 14, wherein the frequency command set is determined by an RF match network.

19. A substrate processing system comprising:
a plurality of RF generators configured to provide a plurality of RF power waveforms to a process chamber during a first duty cycle, wherein the plurality of RF generators include a master RF generator and one or more slave RF generators;
a pulse controller coupled to the plurality of RF generators;
at least one match network coupled to each of the plurality of RF generators, the process chamber, and the pulse controller, wherein the at least one match network includes at least one measuring device configured to measure reflected power or impedance for the plurality of RF power waveforms and at least one variable match component;
wherein at least one of the pulse controller or the at least one match network is configured to:
receive a process recipe for processing the substrate;
set a multiplier for at least one of the plurality of RF generators, wherein the multiplier is a multiple of a base frequency of a TTL signal created by the master RF generator;
divide a first duty cycle of the TTL signal into a high level interval and a low level interval;
determine a frequency command set for each RF generator by calculating a target impedance based on average impedance values and tuning one or more RF match networks to the target impedance and send the frequency command set to each RF generator, wherein the frequency command set includes a frequency set point for each RF generator; and
provide an RF power waveform from each RF generator to a process chamber according to the frequency command set sent to each RF generator.

20. The substrate processing system of claim 19, wherein determining the frequency command set for each RF generator includes:
calculating a high average impedance value across the high level interval;
calculating a low average impedance value across the low level interval; and
calculating the target impedance based on the high average impedance value and the low average impedance value.

* * * * *